US009917158B2

United States Patent
Kittl et al.

(10) Patent No.: US 9,917,158 B2
(45) Date of Patent: Mar. 13, 2018

(54) DEVICE CONTACT STRUCTURES INCLUDING HETEROJUNCTIONS FOR LOW CONTACT RESISTANCE

(71) Applicants: Jorge A. Kittl, Round Rock, TX (US); Borna Josip Obradovic, Leander, TX (US); Robert Christopher Bowen, Austin, TX (US); Mark S. Rodder, Dallas, TX (US)

(72) Inventors: Jorge A. Kittl, Round Rock, TX (US); Borna Josip Obradovic, Leander, TX (US); Robert Christopher Bowen, Austin, TX (US); Mark S. Rodder, Dallas, TX (US)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/942,193

(22) Filed: Nov. 16, 2015

(65) Prior Publication Data

US 2016/0079372 A1 Mar. 17, 2016

Related U.S. Application Data

(63) Continuation-in-part of application No. 14/226,518, filed on Mar. 26, 2014, now Pat. No. 9,685,509.

(Continued)

(51) Int. Cl.
*H01L 29/66* (2006.01)
*H01L 29/267* (2006.01)
(Continued)

(52) U.S. Cl.
CPC ...... *H01L 29/267* (2013.01); *H01L 21/28575* (2013.01); *H01L 29/0847* (2013.01);
(Continued)

(58) Field of Classification Search
CPC ............ H01L 29/267; H01L 21/28575; H01L 21/28581; H01L 29/785; H01L 29/165;
(Continued)

(56) References Cited

U.S. PATENT DOCUMENTS 3,968,272 A 7/1976 Anand
3,995,301 A 11/1976 Magdo
(Continued)

OTHER PUBLICATIONS

Coss et al. "Contact resistance reduction to FinFET source/drain using novel dielectric dipole schottky barrier height modulation method", *IEEE Electron Device Letters*, vol. 32, No. 7, pp. 862-864, Jul. 2011.
(Continued)

*Primary Examiner* — Khiem D Nguyen
(74) *Attorney, Agent, or Firm* — Myers Bigel, P.A.

(57) ABSTRACT

A semiconductor device can include a channel region with a first semiconductor material for a majority carrier in the channel region during operation (on state) of the device and a metal contact. A source/drain region can include a semiconductor material alloy including a second semiconductor material and at least one heterojunction located between the metal contact and the channel region, wherein the heterojunction forms a band-edge offset for the majority carrier that is less than or equal to about 0.2 eV.

16 Claims, 4 Drawing Sheets

Related U.S. Application Data (60) Provisional application No. 62/085,092, filed on Nov. 26, 2014, provisional application No. 61/859,932, filed on Jul. 30, 2013.

(51) Int. Cl.
  *H01L 29/78* (2006.01)
  *H01L 21/285* (2006.01)
  *H01L 29/45* (2006.01)
  *H01L 29/08* (2006.01)

(52) U.S. Cl.
  CPC ...... *H01L 29/452* (2013.01); *H01L 29/66795* (2013.01); *H01L 29/785* (2013.01)

(58) Field of Classification Search
  CPC ............. H01L 21/02532; H01L 29/205; H01L 21/02381; H01L 29/0653; H01L 29/66431; H01L 21/0251
  See application file for complete search history.

(56) References Cited

U.S. PATENT DOCUMENTS

| | | | |
|---|---|---|---|
| 4,394,673 A | 7/1983 | Thompson et al. | |
| 4,554,569 A | 11/1985 | Tove et al. | |
| 4,833,042 A | 5/1989 | Waldrop et al. | |
| 6,774,451 B2* | 8/2004 | Dubois | H01L 29/78654 257/260 |
| 7,170,110 B2* | 1/2007 | Inoue | H01L 21/823807 257/192 |
| 7,208,777 B1 | 4/2007 | Inai et al. | |
| 8,154,025 B2 | 4/2012 | Snyder et al. | |
| 8,294,024 B2 | 10/2012 | Borland et al. | |
| 8,524,562 B2 | 9/2013 | Wang et al. | |
| 8,575,023 B2 | 11/2013 | Ohmi et al. | |
| 8,896,066 B2 | 11/2014 | Glass et al. | |
| 2003/0102490 A1* | 6/2003 | Kubo | H01L 21/28185 257/192 |
| 2008/0050881 A1* | 2/2008 | Chen | H01L 29/165 438/301 |
| 2008/0093631 A1 | 4/2008 | Chi et al. | |
| 2008/0203399 A1* | 8/2008 | Spencer | H01L 29/045 257/77 |
| 2009/0315026 A1 | 12/2009 | Jeong et al. | |
| 2009/0315185 A1 | 12/2009 | Boyanov et al. | |
| 2010/0037941 A1 | 2/2010 | Borland et al. | |
| 2011/0169124 A1* | 7/2011 | Grupp | H01L 21/28537 257/486 |
| 2012/0153387 A1 | 6/2012 | Murthy et al. | |
| 2012/0187490 A1* | 7/2012 | Fried | H01L 21/26586 257/347 |
| 2013/0032860 A1* | 2/2013 | Marino | H01L 29/66462 257/194 |
| 2014/0175603 A1 | 6/2014 | Ananthan et al. | |
| 2014/0327142 A1 | 11/2014 | Harrison et al. | |

OTHER PUBLICATIONS

Tiwari et al. "Empirical fit to band discontinuities and barrier heights in III-V alloy systems", *Applied Physics Letters*, 60:630 (1992).

Hasegawa et al. "Current Transport, Fermi Level Pinning, and Transient Behavior of Group-III Nitride Schottky Barriers", *Journal of the Korean Physical Society*, vol. 55, No. 3, Sep. 2009, pp. 1167-1179.

del Alamo, Jesus A. "Nanometre-scale electronics with III-V compound semiconductors", *Nature*, Nov. 17, 2011, vol. 479, pp. 317-323.

Hu et al. "Novel contact structures for high mobility channel materials", *Materials Research Society Bulletin*, vol. 36, Feb. 2011, 8 Pages.

\* cited by examiner

DEVICE CONTACT STRUCTURES INCLUDING HETEROJUNCTIONS FOR LOW CONTACT RESISTANCE

CROSS-REFERENCE TO RELATED APPLICATIONS

This application is related to and claims the priority of U.S. Provisional Patent Application No. 62/085,092, entitled Structure and method to achieve low contact resistance using heterojunctions, filed in the USPTO on Nov. 26, 2014, and is a continuation-in-part of U.S. patent application Ser. No. 14/226,518, entitled FINFET DEVICES INCLUDING HIGH MOBILITY CHANNEL MATERIALS WITH MATERIALS OF GRADED COMPOSITION IN RECESSED SOURCE/DRAIN REGIONS AND METHODS OF FORMING THE SAME, filed in the USPTO on Mar. 26, 2014 which claims the priority of U.S. Provisional Patent Application No. 61/859,932, entitled FINFET WITH RECESSED AND GRADED SOURCE AND DRAIN MATERIAL FOR LOW TOTAL PARASITIC RESISTANCE, filed in the USPTO on Jul. 30, 2013, the entire disclosures of which are incorporated herein by reference.

FIELD

The present invention relates generally to the field of integrated circuit devices, and more particularly, to integrated circuits devices using materials configured to operate as semiconductors.

BACKGROUND.

As MOS devices continue to be scaled down, parasitic resistance may become a larger problem, which may contribute to a higher percent of total on resistance at each new node compared to previous nodes, and may become a factor in the performance of such devices. In addition, the specific materials chosen for channels of, for example, MOS devices may not always be adequate for, or compatible with, low resistivity contacts.

Parasitic resistance is discussed further, for example, in U.S. Patent Publication numbers 2006/0202266 and 2009/0166742, the disclosures of both of which are incorporated herein by reference in their entireties.

SUMMARY

Embodiments according to the invention can provide device contact structures including heterojunctions for low contact resistance. Pursuant to these embodiments, a semiconductor device can include a channel region with a first semiconductor material for a majority carrier in the channel region during operation (on state) of the device and a metal contact. A source/drain region can include a semiconductor material alloy including a second semiconductor material and at least one heterojunction located between the metal contact and the channel region, wherein the heterojunction forms a band-edge offset for the majority carrier that is less than or equal to about 0.2 eV.

In some embodiments according to the invention, the semiconductor material alloy can include a graded composition of the second semiconductor material and a third semiconductor material, wherein the third semiconductor material is not fully miscible with the first semiconductor material, i.e. it is not possible to obtain the third semiconductor material by continually grading an alloy starting from the first semiconductor material.

In some embodiments according to the invention, the band-edge offset of the heterojunction can be about 0.0 eV.

In some embodiments according to the invention, the band-edge offset of the heterojunction can be less than 0.2 eV and the heterojunction region can be doped with the dopant type corresponding to conduction with the majority carrier.

In some embodiments according to the invention, the graded composition of the semiconductor material alloy can include a rich concentration of the second semiconductor material and a lean concentration of the third semiconductor material at an interface with the first semiconductor material of the channel region and progresses to a lean concentration of the second semiconductor material and a rich concentration of the third semiconductor material at an interface with the metal contact.

In some embodiments according to the invention, the graded composition of the semiconductor material alloy can be provided by $S2_xS3_{1-x}$ where S3 where S3 is the third semiconductor material and S2 is the second semiconductor material. In some embodiments, x=0 at the interface with the metal contact and x=1 at the interface with the first semiconductor material.

In some embodiments according to the invention, an increment in the graded composition of the semiconductor material alloy can be configured to prevent a band-offset between contiguous grades in the graded composition being greater than about 0.2 eV.

In some embodiments according to the invention, an electronic device can include a channel region with a first material for a majority carrier in the channel region during operation of the device and a metal contact. A source/drain region can include a material alloy including at least one material component and can be free of all components of the first material so that compositional grading of the material alloy between the channel region and an interface with the metal contact avoids an abrupt change in band-edge offset between increments in the compositional grading.

In some embodiments according to the invention, the first material has a first lattice structure and the material alloy can have a second lattice structure that is different than the first lattice structure to form a heterojunction having a band-edge offset for the majority carrier that is less than or equal to about 0.2 eV.

In some embodiments, a semiconductor device can include a channel region with a first semiconductor material for a majority carrier in the channel region during operation (on state) of the device and a metal contact. A source/drain region can include a first portion located adjacent to the channel that contains a semiconductor material alloy including a second semiconductor material and a graded composition of the second semiconductor material and a third semiconductor material. A source/drain region can include another portion adjacent to the metal contact that contains a fourth semiconductor material, wherein the interface between the two portions of the source/drain is an heterojunction with a band-edge offset for the majority carrier that is less than or equal to about 0.2 eV and is doped with the dopant type corresponding to the majority carrier. In some of these embodiments, materials can be chosen such that no heterojunction is formed between the portion of the source/drain adjacent to the channel and the channel material. For example, in some embodiments, the semiconductor material alloy is chosen such that the semiconductor material alloy may be graded to be substantially the first semiconductor material at the interface with the channel. In other embodiments, a second heterojunction with a band-edge offset for the majority carrier that is less than or equal to about 0.2 eV and doped with the dopant type corresponding to the majority carrier, can be present at the interface of the semiconductor alloy and the first semiconductor material.

In some embodiments according to the invention, an electronic device terminal structure can include a metal contact and a graded composition layer including a first material (S1) and a second material (S2) combined with one another according to a grading composition within the graded composition layer given by $S1_xS2_{1-x}$ where the composition of the graded composition layer is about fully S2 proximate to the metal contact where x=0 and where the composition of the graded composition layer is about fully S1 remote from the metal contact where x=1, and wherein compositions of the graded composition layer between x=0 and x=1 are sufficient to avoid a band edge offset greater than 0.2 eV within the graded composition layer for a selected carrier of the device. A third material S3 can contact the graded composition layer at a position remote to the metal contact for which x=1, S3 being selected to form a heterojunction with S1 that is equal to or less than about 0.2 eV and wherein S2 can be selected to provide a Schottky barrier height with the metal that is equal to or less than about 0.2 eV.

In some embodiments according to the invention, an electronic device terminal structure can include a metal contact and a graded composition layer including a first material (S1) and a second material (S2) combined with one another according to a grading composition within the graded composition layer given by $S1_xS2_{1-x}$ where the composition of the graded composition layer is about fully S2 proximate to the metal contact where x=0 and where the composition of the graded composition layer is about fully S1 remote from the metal contact where x=1, and wherein compositions of the graded composition layer between x=0 and x=1 are sufficient to avoid a band edge offset greater than 0.2 eV within the graded composition layer for a selected carrier of the device. A third material S3 can be positioned separating the metal contact from the graded composition layer and be adjacent to the graded composition layer at a position where x=0, S3 being selected to form a heterojunction with S2 that is equal to or less than about 0.2 eV and to provide a Schottky barrier height with the metal that is equal to or less than about 0.2 eV.

DETAILED DESCRIPTION OF EMBODIMENTS ACCORDING TO THE INVENTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

It will be understood that, although many of the embodiments described herein relate to semiconductor materials in transistors, the present invention may be utilized with other types of material which can be configured in an electronic device to operate as a semiconductor material, such as a semi-metal material, a degenerate semiconductor material, and combinations thereof.

Furthermore, it will be understood that, although many of the embodiments described herein depict a finFET structure as the channel region, the present invention may be utilized with other types of transistor structures, such as planar transistors, nanowire transistors, MOSFETs, or the like.

As used herein, it will be understood that the term "band-edge" associated with a particular material refers to either the conduction band-edge or valence band-edge for the referenced material depending on the conductivity type of the charge carrier used during operation (on state) of the device (i.e., a pMOS vs. nMOS device). Accordingly, the term "band-edge" may be used by referring to a "relevant carrier" without specifying the type of device. For pMOS devices, the relevant carriers are holes, and the band edge refers to the valence band edge. For nMOS devices, the relevant carriers are electrons, and the band edge refers to the conduction band edge.

As used herein, it will be understood that the term "low contact resistivity" or similar refer to interface contact resistivity values of about 1E-8 ohm-cm$^2$ or less. In some embodiments, it may refer to contact resistivity values of about 1E-7 ohm-cm$^2$ or less. As used herein, it will be understood that the term "low Schottky barrier height" (SBH) or "low barrier" for metals in contact with a semiconductor material includes values of about 0.2 eV or less. As used herein, it will be understood that the term "small" (or similar term) when used to refer to a band offset between the band edges for relevant carriers at an heterojunction between two different material includes values of about 0.2 eV or less. As used herein, it will be understood that the term "small" (or similar term), when used to refer to a band offset formed by an increment or step in a compositional grading of a material, includes values of about 0.2 eV or less, and preferably of about 0.1 eV or less.

As used herein, it will be understood that an expression of the form, for example, $S2_xS3_{1-x}$ means that the two materials (S2,S3) are alloyed with relative compositions such that there are 1−x units of S3 per x units of S2, where the index x can vary between 0 and 1. The alloy $S2_xS3_{1-x}$ may be included in a region (such as in a source/drain region), and the composition of the alloy (indicated by the parameter x) may vary as a function of the position within the region. The terms 'lean' or 'rich' may be used to refer to the proportion of a particular material. For example, an S2 rich $S2_xS3_{1-x}$ alloy is an $S2_xS3_{1-x}$ alloy for which x is close to 1. For example, an S2 lean $S2_xS3_{1-x}$ alloy is an $S2_xS3_{1-x}$ alloy for which x is close to 0.

As used herein, the term semiconductor material may refer to a semiconductor material comprising only one single element, or to a semiconductor material compound comprising more than one element. As used herein, the term semiconductor alloy material refers to a semiconductor material comprising at least two different elements.

As appreciated by the present inventors, in some embodiments according to the invention a low resistivity contact can be provided to a semiconductor material (S1) in a channel region by forming a semiconductor alloy (S2 and S3) having a smoothly graded composition between the channel region and a metal contact for the device. For example, the compositional grading in the semiconductor alloy can be such that the contribution of S2 and S3 in the alloy changes gradually as a function of position within the source/drain region. For example, the compositional grading of the alloy may be arranged such that the semiconductor alloy is essentially S2 proximate to the channel region, whereas the semiconductor alloy is essentially S3 at the metal contact, which is remote from the channel region.

Moreover, the semiconductor materials included in the alloy (S2 and S3) can each be selected to have a specific relationship relative to the semiconductor material in the channel (S1). For example, the semiconductor material (S2) can be selected to have a band edge that is relatively close to that of the semiconductor material S1 (i.e., a low band edge offset) compared to that of the semiconductor material S3. The semiconductor material S3, however, can be selected to have a band edge offset that is relatively large relative to the channel semiconductor material S1. Moreover, the compositional grading of the semiconductor alloy (S2 and S3) within the source/drain region should be smooth so as to avoid any abrupt changes in the band edge within the source/drain region for the relevant carrier.

Accordingly, as appreciated by the present inventors, the semiconductor material S1 in the channel region and the semiconductor material S3 are selected such that one (e.g. S3) cannot be obtained from the other (e.g., S1) through use of continuous compositional grading. In other words, the semiconductor material S2 can be used as an intervening material which is relatively close to the band edge of S1 but can also be present in an alloy with S3.

Accordingly, the semiconductor material S1 can be selected to be significantly different from the semiconductor material S2 but still have a relatively low band edge offset, and, further, the compositional grading of the semiconductor alloy can be used to gradually increase the contribution of S3 and reduce the contribution of S2 as grading progresses toward the metal contact remote from the channel region. It will be further understood that the semiconductor material S3 that is present at the metal contact can be selected to provide a relatively low Schottky barrier height for the relevant carrier.

Figure 3:
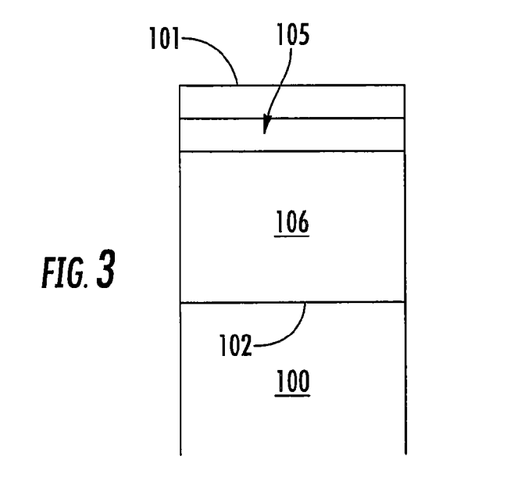

As appreciated by the present inventors, FIG. 3 of the reference: Jenny Hu, H.-S. Philip Wong and Krishna Saraswat (2011). "Novel contact structures for high mobility channel materials". MRS Bulletin, 36, pp 112-120. (available on-line at doi:10.1557/mrs.2011.5 and incorporated herein by reference) and FIG. 4 of the reference: Hideki Hasgawa and Masamichi Akazawa, "Current transport, Fermi Level Pinning, and Transient Behavior of Group-III Nitride Schottky Barriers", Journal of the Korean Physical Society, Vol 55, No 3, September 2009, pp 1167-1179 and incorporated herein by reference, illustrate respective band alignments for different semiconductor materials/compounds/alloys which may be utilized in devices according to the present invention. According to the above materials, some semiconductor materials present Fermi Level Pinning (and in some cases strong Fermi Level Pinning) when in contact to a metal; in this case, the Schottky barrier formed at the metal semiconductor interface has moderate or no dependence on the work function of the metal. The Fermi Level Pinning position is typically close to the charge neutrality level.

Figure 4:
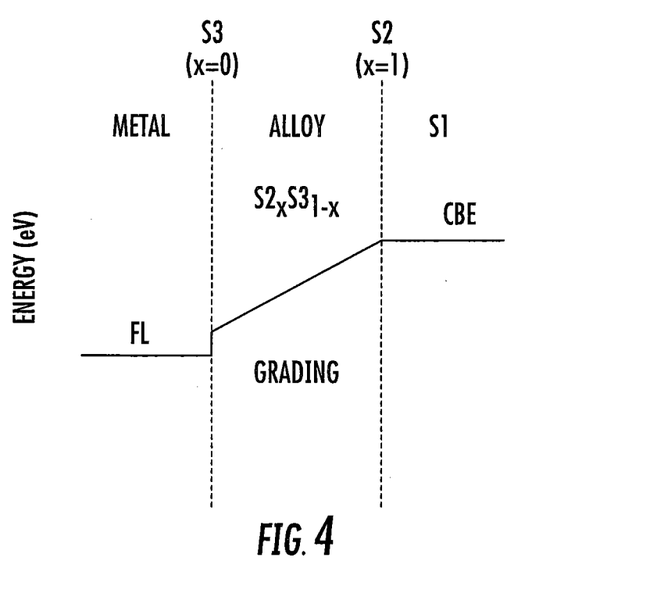
FIG. 4 is a schematic representation of a linear compositional grading profile of the semiconductor material alloy between a channel region material and the metal contact in some embodiments according to the invention.

Still referring to Hu, FIG. 3, and Hasgawa FIG. 4, the charge neutrality levels are indicated for several semiconductor materials. In some embodiments, the semiconductor material chosen to form the metal contact is such that it has Fermi Level Pinning or strong Fermi Level Pinning at a position close to the relevant carrier band edge, so as to provide low Schottky barrier height to the relevant carriers when in contact with a metal.

It will be further understood that, pinning for an InGaSb alloy may be close to the valence band edge. It will be further understood that for InGaAs, InGaN and AlGaN alloys, the absolute position of the charge neutrality level may vary little with composition. In some embodiments, InAs, In-rich In—Ga—As alloys, InN, and In-rich In—Ga—N alloys may be suitable for the semiconductor material used for the alloy interface to the metal contact in nMOS devices. Due to its small gap, InSb may be suitable for nMOS and pMOS devices. For pMOS devices, Ge, InSb, GaSb and In—Ga—Sb alloys may be suitable for use as the semiconductor material used for the alloy interface to the metal contact.

Figure 1:
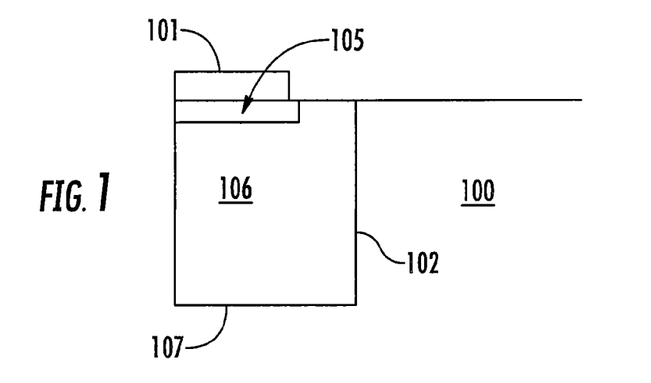
FIG. 1 is a cross-sectional view of a channel region with an adjacent source/drain region that includes a semiconductor material alloy that has a smoothly graded composition between the channel region and a metal contact at an upper surface of the source/drain region in some embodiments according to the invention.

As appreciated by the present inventors, FIG. 1 of "Empirical fit to band discontinuities and barrier heights in III-V alloy systems", Sandip Tiwari and David J. Frank, Appl. Phys. Lett. 60, 630 (1992); (available on-line at dx.doi.org/10.1063/1.06575 and incorporated herein by reference) is a graph illustrating lattice constants and band edge positions of different semiconductor materials in some embodiments according to the invention. Accordingly, Tiwari FIG. 1 may be utilized in selecting appropriate material combinations for use in the channel and source drain regions of the device. As further appreciated by the present inventors, FIG. 1 of "Nanometre-scale electronics with III-V compound semiconductors", by Jests A. del Alamo; Nature 479, 317-323 (17 Nov. 2011) (available on-line at doi:10.1038/nature10677 and incorporated herein by reference) is a graph illustrating mobilities of several semiconductor materials, and may be used to select an appropriate channel material.

The compositional grading of the semiconductor material alloy in the source/drain region can be arranged based on the semiconductor material selected for the interface with the metal contact as well as the semiconductor material to be used in the channel region. For example, in some embodiments according to the invention, high Ge SiGe alloy or Ge for nMOS or pMOS, Si for nMOS or pMOS, SiGe for pMOS, In—Ga—As alloy for nMOS, In—As alloy for nMOS, or In—Ga—Sb alloy for nMOS or pMOS, etc. may be used for the semiconductor material in the channel region. It will be understood, that each of the above parameters (i.e., the semiconductor material used as the interface to the metal contact and the semiconductor material used in the channel region) can be selected to satisfy two conditions: (1) the semiconductor material used in the channel region cannot be smoothly compositionally graded to arrive at the semiconductor material used at the interface to the metal contact and (2) the band edge offset (for the relevant carrier) between the semiconductor material used in the channel region and the semiconductor material selected to be at the interface to the metal contact is significant (i.e., greater than about 0.2 eV).

Given the above, the low resistivity contact can be provided using the smooth compositional grading of the semiconductor alloy in the source/drain region between the channel region and the metal contact. In either case, the semiconductor materials included in the alloy are selected to effectively eliminate barriers to carrier transport in the source/drain region despite the presence of heterojunctions that are formed, for example, either near the metal contact or near the channel region. In either case, the band edge offset provided at the heterojunction should be less than 0.2 eV for the relevant carrier.

It will be understood that the formation of the smoothly graded alloy material can be performed using epitaxial-growth of the selected materials in the source/drain region using the desired compositional expression (such as $S2_x S3_{1-x}$) during the epitaxial-growth process. Further, the formation of the smoothly graded alloy material can be carried out using the approaches described in U.S. patent application Ser. No. 14/226,518, entitled FINFET DEVICES INCLUDING HIGH MOBILITY CHANNEL MATERIALS WITH MATERIALS OF GRADED COMPOSITION IN RECESSED SOURCE/DRAIN REGIONS AND METHODS OF FORMING THE SAME, filed in the USPTO on Mar. 26, 2014 and in U.S. Provisional Patent Application No. 61/859,932, entitled FINFET WITH RECESSED AND GRADED SOURCE AND DRAIN MATERIAL FOR LOW TOTAL PARASITIC RESISTANCE, filed in the USPTO on Jul. 30, 2013, the entire disclosures of which are incorporated herein by reference.

Figure 2:
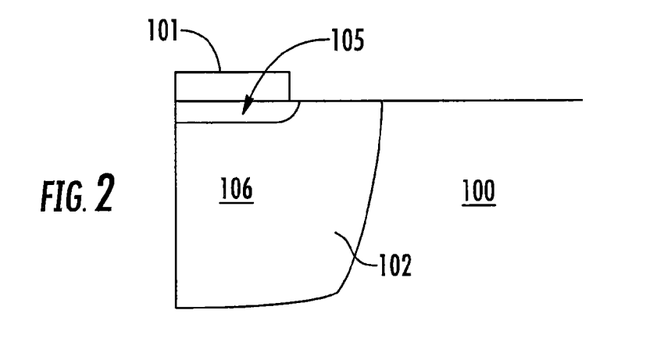
FIGS. 2 and 3 are cross-sectional views of alternative channel regions and associated source/drain region geometries including the respective semiconductor material alloys smoothly graded between the channel region and a metal contact located at an upper surface of the source/drain region in some embodiments according to the invention.

FIG. 1 is a cross-sectional view of a semiconductor device having a region 100 that includes the channel and includes a channel semiconductor material (S1) adjacent to a semiconductor material alloy 106 in a source/drain region 107. The semiconductor material alloy 106 also includes a metal contact interface portion 105 to a metal contact 101 in some embodiments according to the invention. Although FIG. 1 and the associated description, refers to the use of semiconductor materials, other types of materials may also be used in accordance with the present invention. For example, any material that is configured to operate as a semiconductor may be used, such as a semi-metals or a degenerate semi-conductors. Still further, FIGS. 2 and 3 show alternative geometries for the regions 100 and the source/drain regions 107 in some embodiments according to the invention. Accordingly, the geometry of the device in FIG. 1 is exemplary and the present invention is not limited thereto.

Still referring to FIG. 1, the semiconductor material alloy 106 is compositionally graded within the source/drain region 107, for example, from an interface 102 with the region 100 containing the channel, to the metal contact interface portion 105. In other words, the composition of the semiconductor material alloy 106 changes as a function of location within source/drain region 107. In some embodiments, the composition of the semiconductor material alloy 106 changes as a function of location within source/drain region 107 to provide both a heterojunction with the semiconductor material S1 as well as a relatively low Schottky barrier height between the metal contact interface portion 105 and the metal contact 101. In particular, the semiconductor material alloy 106 can be epitaxially grown so that semiconductor material S2 is essentially provided at the interface 102 and is gradually reduced moving toward the metal contact interface portion 105, whereas the semiconductor material S3 is gradually increased as the semiconductor material S2 is reduced such that when the grading of the semiconductor material alloy 106 reaches the metal contact interface portion 105, the semiconductor material alloy 106 is essentially the semiconductor material S3.

It will be understood that, in some embodiments, the semiconductor material S1 in the region 100 forms a heterojunction with the second semiconductor material S2 at the interface 102. Accordingly, the semiconductor material S1 can be substantially different from the semiconductor material S2 and a band edge offset from S2 to S1 may be relatively small (e.g., less than or equal to about 0.2 eV). It will be also understood that in embodiments where a small band offset is present, at the heterojunction (between the semiconductor material S1 in the region 100 containing the channel and the semiconductor material S2 in the semiconductor material alloy 106) doping can be utilized so that no significant barrier to carrier flow occurs at the heterojunction interface during operation of the device.

Figure 5:
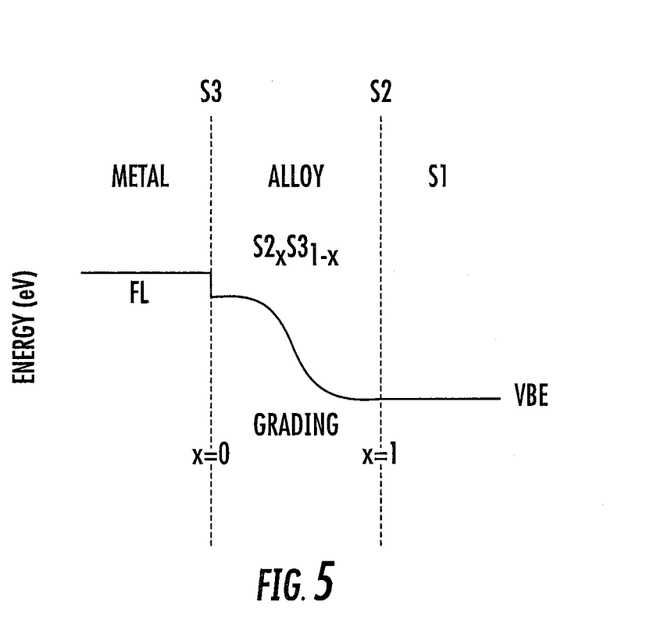
FIG. 5 is a schematic representation of a non-linear compositional grading profile of the semiconductor material alloy between a channel region material and the metal in some embodiments according to the invention.
Figure 6:
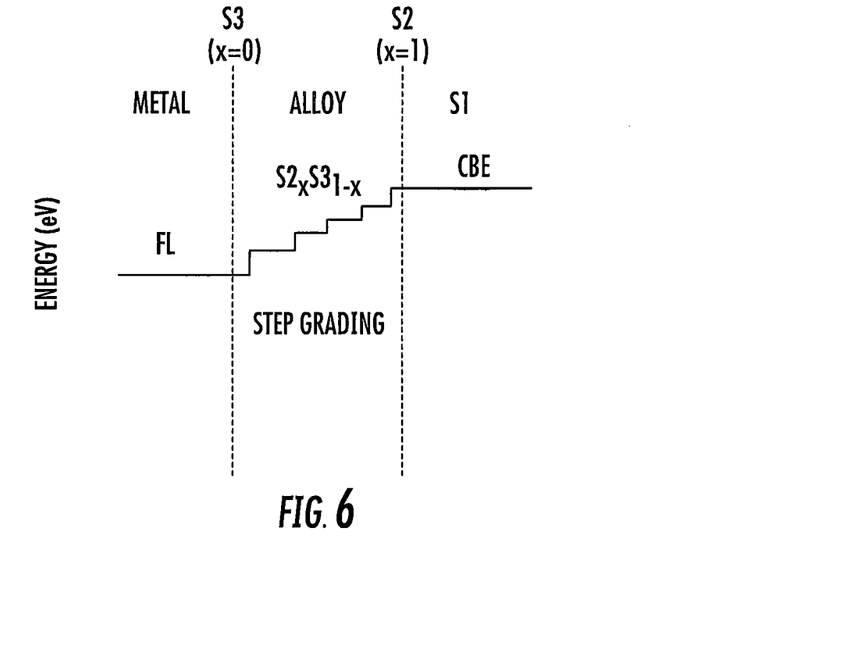
FIG. 6 is a schematic representation of a stepped compositional grading profile of the semiconductor material alloy between a channel region material and the metal contact in some embodiments according to the invention.
Figure 7:
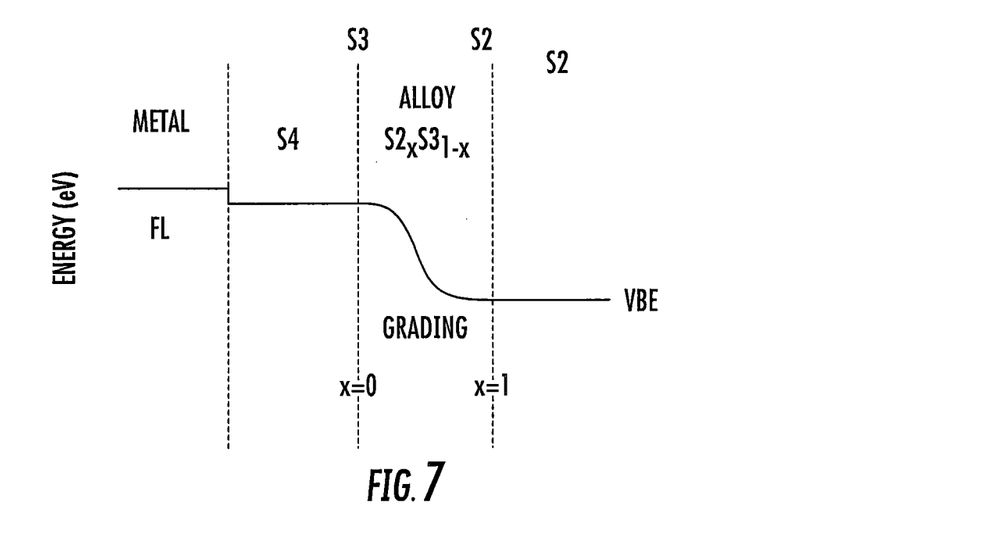
FIG. 7 is a schematic representation of a compositional grading profile of the semiconductor material alloy between the channel region material and an interface material adjacent to the metal in some embodiments according to the invention.
Figure 8:
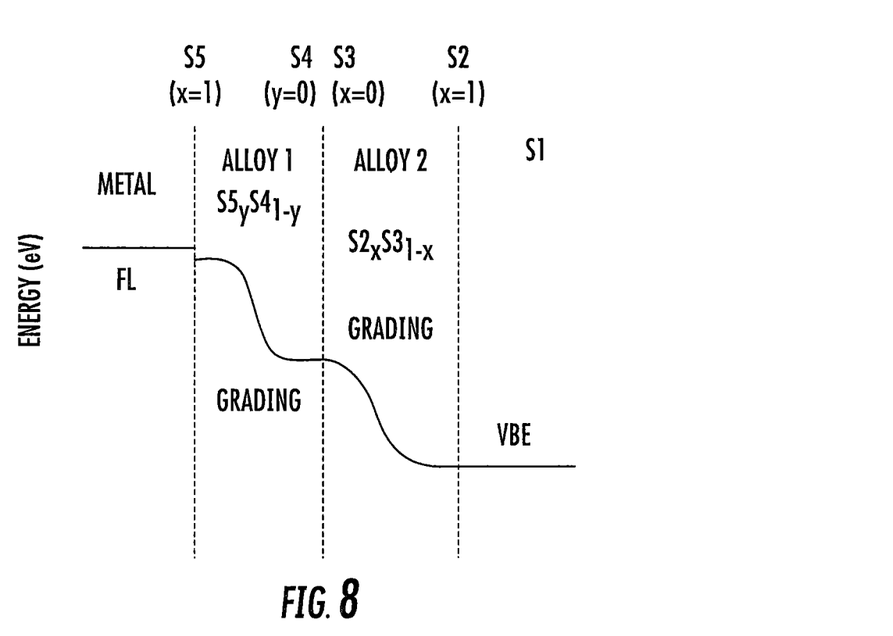
FIG. 8 is a schematic representation of a compositional grading profile of first and second semiconductor material alloys between the channel region material and the metal contact in some embodiments according to the invention.

It will be understood that band alignment diagrams shown in FIGS. 4 to 8 represent the material properties of layers (such as S1,S2,S3, etc) described herein, and not a particular band diagram of a device in a specific operation mode. In FIGS. 4 and 6, for example, CBE refers to the conduction band edge, and the diagrams correspond to possible embodiments illustrated for nMOS devices. It will be understood that similar schemes can be applied to pMOS devices (the band edge illustrated would correspond to the valence band edge in this case). In FIGS. 5, 7 and 8, VBE refers to the valence band edge, and the diagrams correspond to possible embodiments illustrated for pMOS devices. It will be understood that similar schemes can be applied to nMOS devices (the band edge illustrated would correspond to the conduction band edge in this case). Many other diagrams are possible within the scope of this invention.

FIG. 4 is a schematic illustration of a linear compositional grading profile of the semiconductor material alloy 106 in the source/drain region 107. It will be understood that the schematic representation shown in FIG. 4 can be applied to embodiments where the device shown in FIG. 1 is an nMOS device. Referring to FIGS. 1 and 4, the position at which x=1 refers to the interface 102 between the channel region 100 and the source/drain region 107 where the semiconductor material alloy 106 includes the semiconductor material S2 but none of the semiconductor material S3. In some embodiments, at the interface 102, the semiconductor material alloy 106 includes the semiconductor material S2 and a small amount of S3 (i.e., is rich in S2 and lean in S3).

As shown in FIG. 4, the composition of the semiconductor materials S2 and S3 within the alloy 106 may change linearly with the position within the source/drain region 107. It will be understood that all of the materials S1-S3 as well as all intermediate materials expressed by the relationship shown above are stable or metastable within the thermal budgets used in the processing and applications of the devices. Still further, the semiconductor material alloy can be simultaneously doped during the epitaxial-growth of the semiconductor material alloy 106.

Still further, the semiconductor material S3 which is present at the metal contact interface portion 105 to the metal contact 101 is selected to provide a relatively small Schottky barrier height (e.g., equal to or less than about 0.2 eV) for the relevant carrier at the metal contact 101. It will be understood that the compositional grading of the semiconductor materials within the semiconductor material alloy 106 provides relatively small changes in the composition throughout the source/drain region 107. Furthermore, in some embodiments according to the invention, sufficient doping is applied throughout the structure so that screening can effectively eliminate any barriers to relevant carrier transport that may otherwise arise due to changes in the band edge position brought about by the compositional grading.

It will be understood that the description above referring to the screening of barriers to carrier transport using smooth compositional grading can be provided by maintaining variation in the band edge to a particular level over a certain distance within the source/drain region. In some embodiments according to the invention, for doping of about 1E18 $cm^{-3}$ the smooth compositional grading is such that the position of the band edge for relevant carriers varies by about 0.1 eV over about 6 nm or more. In some embodiments, for doping of about 1E19 $cm^{-3}$ the smooth compositional grading is such that the position of the band edge for relevant carriers varies by about 0.1 eV over about 2 nm or more. In some embodiments, for doping of about 1E20 $cm^{-3}$ the smooth compositional grading is such that the position of the band edge for relevant carriers varies by about 0.1 eV over about 0.6 nm or more.

It will be further understood that when doping is provided so that barriers to carrier transport are screened effectively through the compositional grading, certain doping levels can be used in the source/drain region having particular band edge variations over particular distances.

Referring to FIG. 1, in some embodiments according to the invention, it will be understood that doping of the layer 105 may be used to provide low metal contact interface resistance as needed herein. For example, for contacts with, very low Schottky barrier height and for materials in the layer 105 with small tunneling effective masses, a doping concentration of several times 1E19 $cm^{-3}$ may suffice. In some embodiments, doping concentrations of 1E20 $cm^{-3}$ or higher may be used in 105. In most cases, higher doping concentrations in 105 may result in lower contact resistivity even for small Schottky barrier height, such as in the case of contacts to InAs.

Accordingly, in some embodiments, the highest doping concentrations practically achievable may be used in 105.

Similarly, high doping may be used in the case of heterojunctions with a small band edge offset, where higher doping may provide lower heterojunction interface resistance. In some embodiments, doping levels greater than 1E19 $cm^{-3}$ may be used. In some embodiments, doping levels about 1E20 $cm^{-3}$ or higher may be used.

In some embodiments where the arrangement shown, for example, in FIG. 4 is an nMOS device: S1 can be Si, a SiGe alloy or Ge; S2 can be GaAs or an In—Ga—N or an In—Ga—As—N alloy or an In—Al—Ga—As alloy or an Al—Ga—As alloy with the composition of In—Ga—N or In—Ga—As—N or In—Al—Ga—As or Al—Ga—As alloys chosen so that the conduction band edge is within about 0.2 eV or less of the conduction band edge of S1; and S3 can be InAs, InN or an In—As—N alloy or an In—Al—As alloy or an In—Ga—As alloy (in the case of the In—Al—As alloys or In—Ga—As alloys, preferably with In-rich compositions). If S2 is GaAs, in some embodiments, S3 is substantially InAs. In some embodiments, S3 is doped to greater than 1E19 cm$^{-3}$. In some embodiments, doping of S3 is as high as about 1E20 cm$^{-3}$ or higher. In some embodiments, the metal contact 101 is formed with a refractory or a transition metal, so that the metal contact 101 is a reacted transition metal-S3 alloy. The compositional grading of the alloy may be linear as shown in FIG. 4 or non-linear as represented in FIG. 5, or stepwise as represented in FIG. 6.

The metal selected to contact the semiconductor material alloy 106 at the metal contact interface portion 105 (i.e., semiconductor material S3) is selected to provide a low Schottky barrier height (e.g., equal to or less than about 0.2 eV) for the majority carriers.

In some embodiments according to the invention, the metal contact 101 can be a reacted metal contact. In some embodiments according to the invention, the metal contact interface portion 105 including the semiconductor material S3 is performed to provide a low interface contact resistivity.

It will be understood that FIGS. 5 and 6 show alternative profiles for the compositional grading of the semiconductor material alloy 106. In particular, FIG. 5 shows a non-linear compositional grading profile of the semiconductor material alloy 106 whereas FIG. 6 shows a stepped compositional grading profile for the semiconductor material alloy 106. It will be understood that the schematic representations of FIGS. 4 and 6 refer to nMOS devices. It will also be understood that the schematic representations of FIGS. 5, 7 and 8 refer to pMOS devices. It will be further understood, however, that the same principles described above with reference to nMOS may be applied to pMOS devices and vice versa.

In some embodiments where the arrangement shown, for example, in FIG. 1 is an nMOS device: S1 can be Si, a SiGe alloy or Ge; S2 can be GaAs or an In—Ga—N or an In—Ga—As—N alloy or an In—Al—Ga—As alloy or an Al—Ga—As alloy with composition of the In—Ga—N or an In—Ga—As—N or In—Al—Ga—As or Al—Ga—As alloys chosen so that the CBE is within about 0.2 eV or less of the conduction band edge E of S1; and S3 can be InAs, InN or an In—As—N alloy or an In—Al—As alloy or an In—Ga—As alloy (in the case of the In—Al—As alloys or In—Ga—As alloys, preferably with In-rich compositions). If S2 is GaAs, in some embodiments, S3 is substantially InAs. In some embodiments, S3 is doped to greater than 1E19 cm$^{-3}$. In some embodiments, the doping of S3 is as high as about 1E20 cm$^{-3}$ or higher. In some embodiments, the metal contact 101 is formed with a refractory or a transition metal, so that the metal contact 101 is a reacted refractory metal-S3 alloy or a reacted transition metal-S3 alloy respectively.

Referring to FIGS. 1 and 4-6, the semiconductor material alloy 106 has sufficient doping at the surface so that a low contact resistivity interface to the metal contact 101 can be provided. In some embodiments, the semiconductor material alloy 106 has sufficient doping so that carriers find effectively no barrier for the on state of the device. The profile of graded composition of the semiconductor material alloy 106 can also be adjusted to optimize device function, e.g. to reduce diffusion into the channel, etc. In some embodiments, lightly doped extensions can be also be formed. In some embodiments, once the lightly doped extensions are reached (going from the source/drain towards the channel), then the band edge position for the materials used may not change significantly. In other words, the compositional grading may be fully contained within the highly doped region, and the interface to the semiconductor material S1 should be also contained in the highly doped region of the source/drain region.

FIG. 7 is a schematic representation of compositional grading profile of the semiconductor material alloy 106 from the channel region 100 to an intervening semiconductor material as the interface to the metal contact 101 in some embodiments according to the invention. According to FIG. 7, a semiconductor material S2 is selected for the channel region 100 and also selected for inclusion in the alloy 106 along with the semiconductor material S3. Furthermore, the compositional grading profile of the alloy including S2 and S3 is provided according to the relationship S2$_x$S3$_{1-x}$ where x=1 at the interface 102 between the channel region 100 and the semiconductor material alloy 106 in the source/drain region 107, and x=0 at an intermediate position in the source/drain region 107 providing an interface to a semiconductor material S4 as shown.

It will be understood that all of the semiconductor materials (S2, S2$_x$S3$_{1-x}$, and S3) are stable or metastable within the thermal budgets used in the processing and applications of the device. Furthermore, the semiconductor materials can be doped accordingly for pMOS or nMOS devices during the epi-growth of the semiconductor material alloy 106. It will be understood that although the compositional grading shown in FIG. 7 represents a non-linear function other types of grading may also be used (such as other types of continuous grading or stepped grading).

It will be understood that the compositional grading in the alloy 106 should be provided smoothly (i.e., to provide small changes in the composition over the values of x in the source/drain region 107) and provide doping levels so that screening effectively eliminates any barriers to carrier transport that may arise due to changes in the band edge positions throughout the alloy 106 due to the grading.

The semiconductor material S4 is substantially different than semiconductor material S3 so that a heterojunction is formed therebetween with relatively little offset between the band edges for the majority carriers of the device (i.e., equal to or less than about 0.2 eV). It will be further understood that in the case where a small band offset is present at the heterojunction, sufficient doping may be applied to the heterojunction to screen any barrier to carrier flow at the heterojunction.

It will be further understood that the semiconductor material S4 is also selected to provide a relatively small Schottky barrier height with the metal contact 101 (e.g., equal to or less than about 0.2 eV). In some embodiments according to the invention, the metal contact 101 can be a reacted metal contact (i.e., a metal or metallic material generated by the reaction between a metal material and the semiconductor material S4). In some embodiments according to the invention, doping can be applied at the interface between the semiconductor material S4 and the metal contact 101 to provide a low interface contact resistivity.

In an example of a pMOS device employing the graded composition illustrated in FIG. 7, the semiconductor material S4 can be Ge or a high-Ge SiGe alloy, with a heterojunction to GaSb or an InGaSb alloy as S3 which is then graded towards another III-V material in the channel (S2). In some embodiments of pMOS devices S4 can be a high-Ge SiGe alloy, with a heterojunction to InAs alloy as S3 which then is graded towards InGaAs in the channel region 100 (S2).

FIG. 8 is a schematic representation of two graded composition profiles of two semiconductor material alloys within the source/drain region 107 in some embodiments according to the invention. According to FIG. 8, the first alloy can include semiconductor materials S2 and S3 with a compositional grading that changes the alloy from S2 at the interface with the channel region 100 to semiconductor material S3 at an interface with the second graded composition alloy. As shown in FIG. 8, the second graded composition alloy includes semiconductor materials S4 and S5 and transitions from semiconductor material S4 at the interface with the semiconductor material S3 to semiconductor material S5 to provide the metal contact interface portion 105 to the metal contact 101. It will be understood that wherever a heterojunction is present in the representation shown in FIG. 8, the band offset at the heterojunction is small, preferably less than about 0.2 eV, and that doping may be utilized throughout the heterojunction. In some embodiments of an nMOS device with S1 being high Ge SiGe (e.g. 90% Ge or higher) or Ge, S2=S1,S3 can be a lower Ge content SiGe alloy (e.g. SiGe with 60% Ge), S4 can be GaAs; and S5 can be InAs. In some embodiments of an nMOS device with S1 being high Ge SiGe (e.g. 90% Ge or higher) or Ge, S2=S1,S3 can be a lower Ge content SiGe alloy (e.g. SiGe with 60% Ge), S4 can be GaAs; and S5 can be InAs. In some embodiments of an pMOS device where S1 and S2 can be In—Ga—Sb alloy in the channel, S3 can be In—Ga—Sb alloy; S4 can be a SiGe alloy; and S5 can be a high Ge SiGe alloy or Ge.

As described herein, in some embodiments according to the invention a low resistivity contact can be provided to a semiconductor material in a channel region (S1) by forming a semiconductor alloy (composed of components S2 and S3) having a smoothly graded composition between the channel region and a metal contact for the device. For example, the compositional grading in the semiconductor alloy can be such that the contribution of S2 and S3 in the alloy changes gradually as a function of position within the source/drain region. For example, the compositional grading of the alloy may be arranged such that the semiconductor alloy is essentially S2 proximate to the channel region, whereas the semiconductor alloy is essentially S3 at the metal contact, which is remote from the channel region.

Moreover, the semiconductor materials included in the alloy (composed of components S2 and S3) can each be selected to have a specific relationship relative to the semiconductor material in the channel (S1). For example, the semiconductor material S2 can be selected to have a band edge that is relatively close to that of the semiconductor material S1 (i.e., a low band edge offset) compared to that of the semiconductor material S3. The semiconductor material S3, however, can be selected to have a band edge offset that is relatively large relative to the channel semiconductor material S1. The semiconductor material S3 may be selected to have a low contact resistivity to metals (preferably of $10^{-8}$ ohm-cm$^2$ or less, and in some embodiments of $10^{-7}$ ohm-cm$^2$ or less). Moreover, the compositional grading of the semiconductor alloy (composed of components S2 and S3) within the source/drain region should be smooth so as to avoid any abrupt changes in the band edge within the source/drain region for the relevant carrier.

Accordingly, as appreciated by the present inventors, the semiconductor material S1 in the channel region and the semiconductor material S3 are selected such that one (e.g. S3) cannot be obtained from the other (e.g., S1) through use of continuous compositional grading. In other words, the semiconductor material S2 can be used as an intervening material which is relatively close to the band edge of S1 but can also be present in an alloy with S3.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:

1. A semiconductor device comprising:
 a channel region comprising a first semiconductor material for a majority carrier in the channel region during operation (on state) of the device;
 a metal contact;
 a source/drain region comprising a semiconductor material alloy including a second semiconductor material; and
 at least one heterojunction located in the source/drain region between the metal contact and the channel region, wherein the at least one heterojunction forms a band-edge offset for the majority carrier that is less than or equal to about 0.2 eV,
 wherein the semiconductor material alloy comprises a graded composition of the second semiconductor material,
 wherein the graded composition comprises a lean second semiconductor material concentration at an interface with the first semiconductor material of the channel region and progresses to a rich second semiconductor material concentration remote from the interface with the first semiconductor material,
 wherein the graded composition comprises a graded composition of the second semiconductor material and a third semiconductor material, wherein the second semiconductor material is not fully miscible with the first semiconductor material, and
 wherein the graded composition of the semiconductor material alloy comprises a rich concentration of the third semiconductor material and the lean second semiconductor material concentration at the interface with the first semiconductor material of the channel region and progresses to a lean concentration of the third semiconductor material and the rich second semiconductor material concentration at an interface with the metal contact.

2. The semiconductor device of claim 1 wherein a region of the at least one heterojunction is doped with a dopant type corresponding to conduction with the majority carrier.

3. The semiconductor of claim 1 wherein the graded composition of the semiconductor material alloy is provided by $S3_xS2_{1-x}$ where S3 is the third semiconductor material, S2 is the second semiconductor material, and x=0 at the interface with the metal contact and x=1 at the interface with the first semiconductor material.

4. The semiconductor device of claim 3 wherein an increment in the graded composition of the semiconductor material alloy is configured to prevent a band-offset between contiguous grades in the graded composition being greater than about 0.2 eV.

5. The semiconductor device of claim 1 wherein the source/drain region comprises one of the third semiconductor material or the semiconductor material alloy at the interface with the metal contact and wherein respective materials of the metal contact and the one of the third semiconductor material or the semiconductor material alloy at the interface with the metal contact are selected to provide a Schottky barrier height therebetween that is equal to about 0.2 eV or less.

6. The semiconductor device of claim 1 wherein the graded composition is a linear graded composition, a non-linear graded composition, a stepped graded composition, or a combination thereof.

7. The semiconductor device of claim 1 wherein the first semiconductor material comprises at least one group IV semiconductor element, the second semiconductor material comprises a group III-V semiconductor compound or a group III-V semiconductor alloy, and the semiconductor material alloy comprises the third semiconductor material and the second semiconductor material.

8. The semiconductor device of claim 1 wherein the device comprises an NMOS device and the first semiconductor material comprises Si, a SiGe alloy, or Ge, the second semiconductor material comprises InAs, InN, an In—As—N alloy, an In—Al—As alloy, or an In—Ga—As alloy, and the third semiconductor material comprises GaAs, In—Ga—N, an In—Ga—As—N alloy, an In—Al—Ga—As alloy, or an Al—Ga—As alloy.

9. A semiconductor device comprising:
a channel region comprising a first semiconductor material for a majority carrier in the channel region during operation (on state) of the device;
a metal contact;
a source/drain region comprising a semiconductor material alloy including a second semiconductor material; and
at least one heterojunction located in the source/drain region between the metal contact and the channel region, wherein the at least one heterojunction forms a band-edge offset for the majority carrier that is less than or equal to about 0.2 eV,
wherein the semiconductor material alloy comprises a graded composition of the second semiconductor material,
wherein the graded composition comprises a lean second semiconductor material concentration at an interface with the first semiconductor material of the channel region and progresses to a rich second semiconductor material concentration remote from the interface,
wherein the graded composition comprises a graded composition of the first semiconductor material and the second semiconductor material,
wherein the graded composition of the semiconductor material alloy comprises a rich concentration of the first semiconductor material and the lean second semiconductor material concentration at the interface with the first semiconductor material of the channel region and progresses to a lean concentration of the first semiconductor material and the rich second semiconductor material concentration remote from the interface to form the at least one heterojunction with a third semiconductor material, and
wherein the third semiconductor material is not fully miscible with the first semiconductor material.

10. A semiconductor device comprising:
a channel region comprising a first semiconductor material for a majority carrier in the channel region during operation (on state) of the device;
a metal contact;
a source/drain region comprising a semiconductor material alloy including a second semiconductor material; and at least one heterojunction located in the source/drain region between the metal contact and the channel region, wherein the at least one heterojunction forms a band-edge offset for the majority carrier that is less than or equal to about 0.2 eV,
wherein the semiconductor material alloy comprises a graded composition of the second semiconductor material,
wherein the graded composition comprises a lean second semiconductor material concentration at an interface with a first semiconductor material of the channel region and progresses to a rich second semiconductor material concentration remote from the interface,
wherein the graded composition comprises a graded composition of the second semiconductor material and a third semiconductor material, wherein the second semiconductor material is not fully miscible with the first semiconductor material, and
wherein the graded composition is a first graded composition of the second semiconductor material and a third semiconductor material and the semiconductor material alloy is a first graded semiconductor material alloy, the semiconductor further comprising:
a second graded composition alloy located in the source/drain region between the channel region and the first graded composition, the second graded composition alloy comprising a second graded composition of a fourth semiconductor material and a fifth semiconductor material, wherein the fifth semiconductor material is not fully miscible with the first semiconductor material.

11. An electronic device comprising:
a channel region comprising a first semiconductor material for a majority carrier in the channel region during operation (on state) of the device;
a metal contact; and
a source/drain region comprising a material alloy including at least one semiconductor material component and is free of all components of the first semiconductor material so that compositional grading of the material alloy between the channel region and an interface with the metal contact avoids an abrupt change in band-edge offset between increments in the compositional grading and at any heterojunction therein,
wherein the material alloy comprises a graded composition of the at least one semiconductor material component,
wherein the graded composition comprises a lean semiconductor concentration of the at least one semiconductor material component at an interface with the first semiconductor material of the channel region and progresses to a rich semiconductor concentration of the at least one semiconductor material component at the interface with the metal contact, and
wherein the first semiconductor material and the material alloy at the interface with the first semiconductor material form an heterojunction having a band-edge offset for the majority carrier that is less than or equal to about 0.2 eV.

12. The electronic device of claim 11 wherein the band-edge offset for the majority carrier is less than or equal to about 0.1 eV.

13. The electronic device of claim 12 wherein the material alloy is doped to in a range between about 1E18 cm$^{-3}$ to about 1E20 cm$^{-3}$.

14. The electronic device of claim 13 wherein the band-edge offset between increments is in a range between about 0.1 eV over about 6 nm and about 0.1 eV over about 0.6 nm.

15. An electronic device terminal structure comprising:
a metal contact;
a graded composition layer including a first material (S1) and a second material (S2) combined with one another according to a grading composition within the graded composition layer given by $S2_xS2_{1-x}$ where the composition of the graded composition layer is about fully S2 proximate to the metal contact where x=0 and where the composition of the graded composition layer is about fully S1 remote from the metal contact where x=1, and wherein compositions of the graded composition layer between x=0 and x=1 are sufficient to avoid a band edge offset greater than 0.2 eV within the graded composition layer for a selected carrier of the device;
a third material S3 contacting the graded composition layer at x=1, S3 being selected to form a heterojunction with S1 that is equal to or less than about 0.2 eV; and
wherein S2 is selected to provide a Schottky barrier height with the metal that is equal to or less than about 0.2 eV.

16. The electronic device of claim 15 wherein S1, S2, and S3 are configured to operate in the device as respective semiconductor materials.

\* \* \* \* \*